United States Patent
Takenaka et al.

(10) Patent No.: US 12,170,312 B2
(45) Date of Patent: Dec. 17, 2024

(54) SUPER JUNCTION SILICON CARBIDE SEMICONDUCTOR DEVICE AND MANUFACTURING METHOD THEREOF

(71) Applicant: FUJI ELECTRIC CO., LTD., Kawasaki (JP)

(72) Inventors: Kensuke Takenaka, Tsukuba (JP); Takeshi Tawara, Tsukuba (JP); Shinsuke Harada, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 478 days.

(21) Appl. No.: 17/685,930

(22) Filed: Mar. 3, 2022

(65) Prior Publication Data
US 2022/0285489 A1    Sep. 8, 2022

(30) Foreign Application Priority Data
Mar. 8, 2021   (JP) ................. 2021-036720

(51) Int. Cl.
  *H01L 29/06*   (2006.01)
  *H01L 29/16*   (2006.01)
  *H01L 29/66*   (2006.01)
  *H01L 29/78*   (2006.01)

(52) U.S. Cl.
  CPC ...... *H01L 29/0634* (2013.01); *H01L 29/1608* (2013.01); *H01L 29/66068* (2013.01); *H01L 29/7813* (2013.01)

(58) Field of Classification Search
  CPC ............... H01L 29/1608; H01L 29/063; H01J 2201/308
  See application file for complete search history.

(56) References Cited

U.S. PATENT DOCUMENTS

| 2011/0287598 A1 | 11/2011 | Shimatou |
| 2015/0171169 A1 | 6/2015 | Harada |
| 2017/0271442 A1* | 9/2017 | Uehara ............... H01L 29/0634 |
| 2018/0197983 A1 | 7/2018 | Kinoshita et al. |

FOREIGN PATENT DOCUMENTS

| JP | 2009-130106 A | 6/2009 |
| JP | 2011-243866 A | 12/2011 |
| WO | 2013/179820 A1 | 12/2013 |
| WO | 2017/064949 A1 | 4/2017 |

* cited by examiner

*Primary Examiner* — Hsien Ming Lee
(74) *Attorney, Agent, or Firm* — Rabin & Berdo, P.C.

(57) ABSTRACT

A method of manufacturing a superjunction silicon carbide semiconductor device is provided, enabling a reduction of the number of times a combination of epitaxial growth and ion implantation for forming a parallel pn structure is performed. In the method of manufacturing the superjunction silicon carbide semiconductor device, forming an epitaxial layer 2*a*, 2*b* of a second conductivity type on a front surface of a silicon carbide semiconductor substrate 1 of a first conductivity type and selectively forming semiconductor regions 4*a*, 4*b* of the first conductivity type by implanting nitrogen ions in the epitaxial layer are repeated multiple times, thereby forming the parallel pn structure.

3 Claims, 5 Drawing Sheets

SUPER JUNCTION SILICON CARBIDE SEMICONDUCTOR DEVICE AND MANUFACTURING METHOD THEREOF

BACKGROUND OF THE INVENTION

1. Field of the Invention

The invention relates to a method of manufacturing a superjunction silicon carbide semiconductor device.

2. Description of the Related Art

In a conventional silicon carbide metal oxide semiconductor field effect transistor (MOSFET), by combining epitaxial growth and ion implantation, a high-quality interface between a gate oxide film and silicon carbide is created and low resistance is realized. Further, the structure is such that high electric field is not applied to the gate oxide film, whereby a semiconductor device having a high breakdown voltage and high reliability is realized (for example, refer to International Publication No. WO 2017/064949).

For example, to realize low resistance, a high-quality interface between the gate oxide film and silicon carbide is created and an impurity concentration of a junction field effect transistor (JFET) portion is increased, thereby realizing low resistance. Further, a p-type region for mitigating electric field beneath a gate electrode is formed, thereby realizing high breakdown voltage and high reliability. Further, a deep p-type region is formed beneath a contact region and a flow of avalanche current near the gate electrode is eliminated, whereby the load on the gate electrode is reduced; the avalanche current is generated when high voltage equal to or exceeding a performance limit of a drain electrode is applied. Further, by the deep p-type region beneath the contact region, a flow of large current near the gate electrode is eliminated even when a built-in diode is operated, whereby the load on the gate electrode is reduced and reliability is enhanced.

Here, in a normal n-type channel vertical MOSFET, among multiple semiconductor layers formed in a semiconductor substrate, an n-type conduction layer (drift layer) is the semiconductor layer having the highest resistance. The electrical resistance of the n-type drift layer has a significant impact on the overall on-resistance of the vertical MOSFET. Reduction of the overall on-resistance of the vertical MOSFET can be realized by reducing a thickness of the n-type drift layer and shortening the current path.

Nonetheless, in an off state, a depletion layer spreads to the n-type drift layer, which has a high resistance, whereby the vertical MOSFET has a function of sustaining the breakdown voltage. Therefore, in an instance in which the n-type drift layer is made thinner to reduce the on-resistance, the spreading of the depletion layer in the off state is shortened, whereby the breakdown field strength is easily reached by a low application voltage and the breakdown voltage decreases. On the other hand, to increase the breakdown voltage of the vertical MOSFET, the thickness of the n-type drift layer has to be increased, whereby the on-resistance increases. Such a relationship between the on-resistance and the breakdown voltage is called a tradeoff relationship and enhancing both properties having a tradeoff relationship is generally difficult. The on-resistance and the breakdown voltage are known to have a similar tradeoff relationship in semiconductor devices such as insulated gate bipolar transistors (IGBTs), bipolar transistors, and diodes.

A superjunction (SJ) structure is known as a structure of a semiconductor device to solve such problems described above (for example, refer to International Publication No. WO 2013/0179820 and Japanese Laid-Open Patent Publication No. 2009-130106). FIG. 8 is a cross-sectional view of a structure of a conventional superjunction silicon carbide semiconductor device.

In FIG. 8, as a superjunction silicon carbide semiconductor device, a MOSFET that has a superjunction structure (hereinafter, SJ-MOSFET) is depicted. As depicted in FIG. 8, a SJ-MOSFET 150 uses, as a material, a wafer in which an n-type buffer layer 115 and an n-type drift layer 123 are grown on an n$^+$-type silicon carbide semiconductor substrate 101 having a high impurity concentration. P-type column regions 103 that penetrate the n-type drift layer 123 from a surface of the wafer but do not reach the n$^+$-type silicon carbide semiconductor substrate 101 are provided. While the p-type column regions 103 do not reach the n$^+$-type silicon carbide semiconductor substrate 101 in FIG. 8, the p-type column regions 103 may reach the n$^+$-type silicon carbide semiconductor substrate 101.

Further, in the n-type drift layer 123, the SJ-MOSFET 150 has a parallel structure (hereinafter, referred to as "parallel pn structure 121") in which n-type regions (portions of the n-type drift layer 123 sandwiched between the p-type column regions 103, hereinafter, referred to as "n-type column regions 104") and p-type regions (the p-type column regions 103) extending in a direction orthogonal to a main surface of the substrate and having a narrow width in a plane parallel to the main surface of the substrate are arranged to repeatedly alternate one another in a plane parallel to the main surface of the substrate. The p-type column regions 103 and the n-type column regions 104 configuring the parallel pn structure 121 are regions having impurity concentrations that have been increased corresponding to that of the n-type drift layer 123. In the parallel pn structure 121, by substantially balancing the charge of impurity amounts that are a product of an area and the impurity concentration contained in the p-type column regions 103 and a product of an area and the impurity concentration contained in in the n-type column regions 104, a pseudo non-doped layer may be created in the off state, thereby enabling the breakdown voltage to be increased.

In FIG. 8, reference numerals 105, 106, 107, 108, 109, 110, 111, 112, 113, 114, and 116 represent an n-type high-concentration region, a p-type base layer, n$^+$-type source regions, p$^{++}$-type contact regions, a gate insulating film, gate electrodes, an interlayer insulating film, a source electrode, a backside electrode, p$^+$-type base regions, and trenches, respectively.

Further, according to a known method of manufacturing a superjunction semiconductor device, on a high-concentration n-type semiconductor substrate, n-type semiconductor regions and p-type semiconductor regions are formed in columns orthogonal to a main surface while in a parallel direction, parallel pn layers adjacent to one another are formed by epitaxial growth (for example, refer to Japanese Laid-Open Patent Publication No. 2011-243866).

SUMMARY OF THE INVENTION

To solve the problems described below and achieve an object, a method of manufacturing a superjunction silicon carbide semiconductor device according to the present invention has the following features. First, a first process is performed in which a parallel pn structure is formed on a front surface of a silicon carbide semiconductor substrate of a first conductivity type, the parallel pn structure having first columns of the first conductivity type and second columns of a second conductivity type disposed to repeatedly alternate one another in a plane parallel to the front surface. Next, a second process is performed in which a first semiconductor layer of the second conductivity type is formed on the surface of the parallel pn structure. Next, a third process is performed in which first semiconductor regions of the first conductivity type are selectively formed in a surface layer of the first semiconductor layer. Next, a fourth process is performed in which a gate insulating film in contact with the first semiconductor layer is formed. Next, a fifth process is performed in which, on a surface of the gate insulating film opposite to that in contact with the first semiconductor layer, a gate electrode is formed. Next, a sixth process is performed in which a first electrode that is in contact with the first semiconductor layer and the first semiconductor regions is formed. Next, a seventh process is performed in which a second electrode is formed on a back surface of the silicon carbide semiconductor substrate. In the first process, forming an epitaxial layer of the second conductivity type on the front surface of the silicon carbide semiconductor substrate and selectively forming semiconductor regions of the first conductivity type by implanting nitrogen ions in the epitaxial layer are repeated multiple times, thereby forming the parallel pn structure.

A further feature of the method of manufacturing a superjunction silicon carbide semiconductor device according to the invention described above is that an acceleration energy when the nitrogen ions are implanted is in a range of 10 keV to 50 MeV.

A further feature of the method of manufacturing a superjunction silicon carbide semiconductor device according to the invention described above is that the method further includes after the third process but before the fourth process, an eighth process in which trenches that penetrate through the first semiconductor layer and the first semiconductor regions and reach the first columns are formed; in the fourth process, the gate insulating film is formed in the trenches; and in the fifth process, the gate electrode is formed in each of the trenches via the gate insulating film.

DETAILED DESCRIPTION OF THE INVENTION

Problems to be addressed are discussed. In the method of manufacturing the superjunction silicon carbide semiconductor device, impurity elements are minimally diffused in silicon carbide (SiC) and therefore, the parallel pn structure 121 is formed by a combination of epitaxial growth and ion implantation. For example, the SJ-MOSFET 150 is manufactured as follows. FIGS. 9, 10, 11, and 12 are cross-sectional views depicting states of the conventional superjunction silicon carbide semiconductor device during manufacture.

Figure 9:
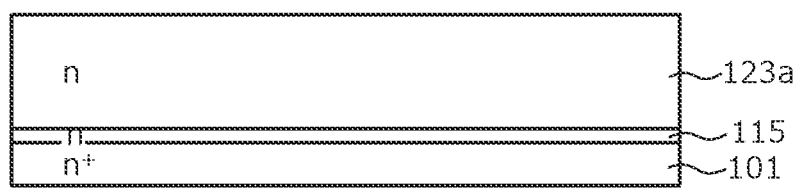
FIG. 9 is a cross-sectional view depicting a state of a conventional superjunction silicon carbide semiconductor device during manufacture.

First, an $n^+$-type silicon carbide substrate 101 containing an n-type single crystal 4H-SiC (4-layer periodic hexagonal silicon carbide) is prepared. Then, the n-type buffer layer 115 and a first n-type drift layer 123a are epitaxially grown on a first main surface of the $n^+$-type silicon carbide substrate 101. The state up to here is depicted in FIG. 9.

Figure 10:
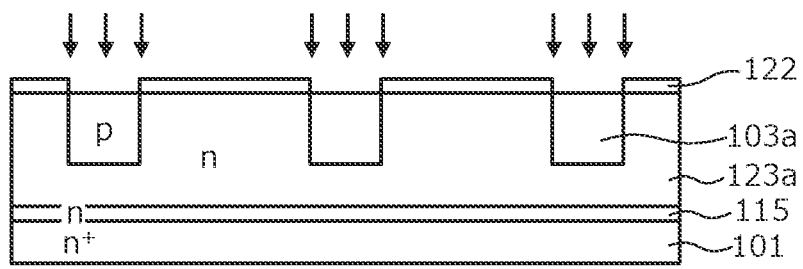
FIG. 10 is a cross-sectional view depicting a state of the conventional superjunction silicon carbide semiconductor device during manufacture.

Next, on the surface of the first n-type drift layer 123a, by a photolithographic technique, an ion implantation mask 122 having predetermined openings is formed using an oxide film. Then, aluminum ions (hereinafter, "Al ions") are implanted in the openings of the oxide film, thereby forming first p-type column regions 103a. The state up to here is depicted in FIG. 10.

Next, on a front side of the first n-type drift layer 123a, a second n-type drift layer 123b containing silicon carbide is epitaxially grown doped with nitrogen atoms. The state up to here is depicted in FIG. 11.

Next, on the surface of the second n-type drift layer 123b, the ion implantation mask 122 having predetermined openings is formed by a photolithographic technique using an oxide film. Then, Al ions are implanted in the openings of the oxide film, thereby forming second p-type column regions 103b. The state up to here is depicted in FIG. 12.

Figure 11:
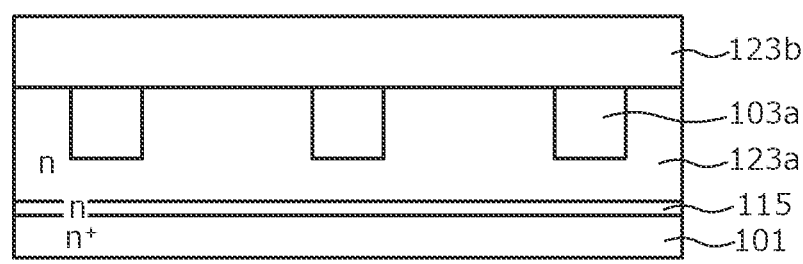
FIG. 11 is a cross-sectional view depicting a state of the conventional superjunction silicon carbide semiconductor device during manufacture.
Figure 12:
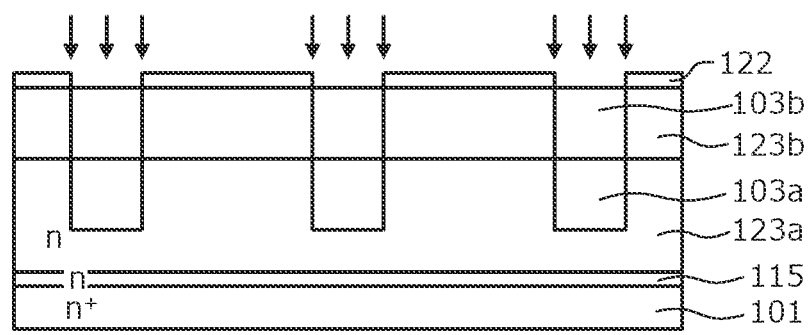
FIG. 12 is a cross-sectional view depicting a state of the conventional superjunction silicon carbide semiconductor device during manufacture.

Next, a process including the epitaxial growth in FIG. 11 and the ion implantation in FIG. 12 is repeated a predetermined number of times, whereby the p-type column regions 103 and the n-type column regions 104 are formed. Here, the n-type high-concentration region 105 is formed by the epitaxial growth and the $p^+$-type base regions 114 are formed by the ion implantation. The first p-type column regions 103a and the second p-type column regions 103b are portions of the p-type column regions 103 while the first n-type drift layer 123a and the second n-type drift layer 123b are portions of the n-type column regions 104.

Next, on the surfaces of the p-type column regions 103 and the n-type column regions 104, the p-type base layer 106 doped with a p-type impurity such as aluminum is formed. Next, on the surface of the p-type base layer 106, the n⁺-type source regions 107 and the p⁺⁺-type contact regions 108 are formed. Next, a heat treatment (annealing) is performed on the ion-implanted regions, thereby implementing an activation process.

Figure 8:
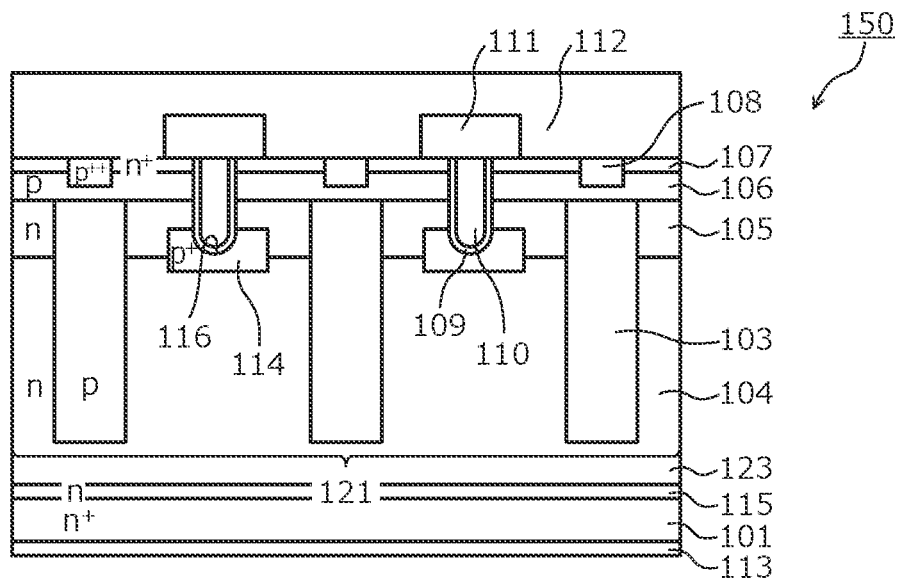
FIG. 8 is a cross-sectional view of a structure of a conventional superjunction silicon carbide semiconductor device.

Next, the trenches 116, the gate insulating film 109, the gate electrodes 110, the interlayer insulating film 111, the source electrode 112, a source electrode pad (not depicted), the backside electrode 113, and a drain electrode pad (not depicted) are formed. Thus, as described, the SJ-MOSFET 150 depicted in FIG. 8 is completed.

As just described, the conventional superjunction silicon carbide semiconductor device is fabricated (manufactured) by forming the p-type column regions 103 and the n-type column regions 104 by periodically implanting Al ions at a constant depth in portions of the n-type drift layer 123 containing the n-type single crystal 4H-SiC.

Here, to manufacture a high-voltage superjunction silicon carbide semiconductor device, the film thickness of the n-type drift layer 123 containing the n-type single crystal 4H-SiC has to be increased. Accordingly, the depth of the p-type column regions 103, which are formed by ion implantation, must also be increased.

Here, the range of Al ions in the single crystal 4H-SiC is short and therefore, high acceleration energy is necessary to form the p-type column regions 103 deeply by ion implantation. In this instance, to deter implantation of the Al ions in the n-type column regions 104, the ion implantation mask 122 that is used has to be thicker. Nonetheless, for a SiO₂ mask formed by a plasma CVD method, when the film thickness is increased, the substrate becomes significantly warped, whereby a problem arises in that device processes become difficult, and it becomes difficult to process the trenches 116 to have a favorable tapered shape by dry etching.

Therefore, the superjunction silicon carbide semiconductor device is manufactured by a multistage process in which a target thickness for the epitaxial growth of the n-type drift layer 123 is thin at about 0.8 μm and in formation regions of the p-type column regions 103, a portion of each of the p-type column regions 103 is formed by Al-ion implantation with an acceleration energy of 700 KeV, which can stop diffusion by a SiO₂ mask having a relatively thin film thickness; again, the target thickness for the epitaxial growth is only about 0.8 μm and the n-type 4H-SiC epitaxial growth is performed and at the same positions as in the first session, the Al-ion implantation is repeatedly performed. However, only about 0.8 μm of the parallel pn structure 121 is formed by one session of the combination of epitaxial growth and ion implantation and therefore, formation of the parallel pn structure 121 requires a lot of time, whereby the lead time for manufacturing the superjunction silicon carbide semiconductor device is long and reductions in manufacturing cost are impossible.

To solve the problems associated with the conventional techniques above, one object of the present invention is to provide a method of manufacturing a superjunction silicon carbide semiconductor device, whereby the number of combinations of epitaxial growth and ion implantation for forming a parallel pn structure may be reduced.

Embodiments of a method of manufacturing a superjunction silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols are the same such as n's and p's that include + or − indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
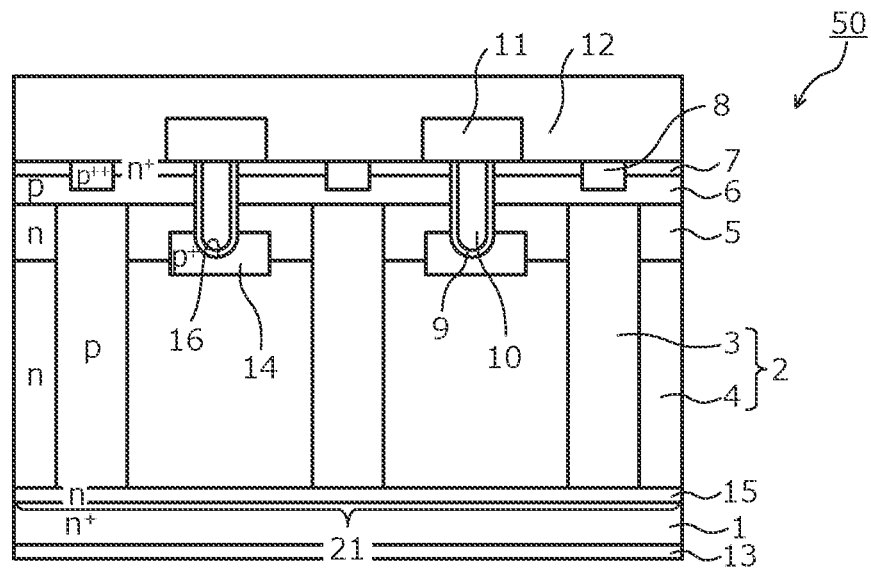
FIG. 1 is a cross-sectional view of a structure of a superjunction silicon carbide semiconductor device according to an embodiment.

FIG. 1 is a cross-sectional view of a structure of a superjunction silicon carbide semiconductor device according to an embodiment. A superjunction silicon carbide semiconductor device according to the present invention is described taking a SJ-MOSFET 50 as an example. The SJ-MOSFET 50 depicted in FIG. 1 is a SJ-MOSFET that includes metal oxide semiconductor (MOS) gates on a front side (side having a later-described p-type base layer 6) of semiconductor base substrate (silicon carbide base substrate: semiconductor chip) that contains silicon carbide. In FIG. 1, only two unit cells (functional units of a device element) are depicted and other unit cells adjacent to these are not depicted.

As depicted in FIG. 1, in the SJ-MOSFET 50 according to the embodiment, a p-type drift layer 2 is deposited on a first main surface (front surface), for example, the 4H-SiC (0001) Si-face, of an n⁺-type silicon carbide substrate (silicon carbide semiconductor substrate of a first conductivity type) 1. An n-type buffer layer 15 may be deposited between the n⁺-type silicon carbide substrate 1 and the p-type drift layer 2.

The n⁺-type silicon carbide substrate 1, for example, is a silicon carbide single crystal substrate doped with nitrogen (N). The p-type drift layer 2 includes p-type column regions 3 and n-type column regions 4. Each of the n-type column regions 4 has a first side and a second side opposite to each other, the first side having a surface layer and the second side facing the n⁺-type silicon carbide substrate 1; and n-type high-concentration regions 5 may be selectively provided in the surface layers of the n-type column regions 4. The n-type high-concentration regions 5 constitute a high-concentration n-type drift layer having an impurity concentration that is lower than an impurity concentration of the n⁺-type silicon carbide substrate 1 but higher than an impurity concentration of the n-type column regions 4 described hereinafter. The n-type high-concentration regions 5 constitute a so-called current spreading layer (CSL) that reduces carrier spreading resistance.

The p-type drift layer 2 has a first side and a second side that are opposite to each other, the second side facing the n⁺-type silicon carbide substrate 1; and a p-type base layer (first semiconductor layer of a second conductivity type) 6 is provided at the first side of the p-type drift layer 2. Hereinafter, the n⁺-type silicon carbide substrate 1, the p-type drift layer 2, and the p-type base layer 6 combined are assumed as a silicon carbide semiconductor base substrate.

The n-type buffer layer 15 is a buffer layer that is doped with, for example, nitrogen, to have an impurity concentration about the same as that of the n⁺-type silicon carbide substrate 1. In the n-type buffer layer 15, recombination of electrons and holes advances, thereby suppressing the density of holes injected into the n⁺-type silicon carbide substrate 1, whereby occurrences of triangular and bar-shaped stacking faults are effectively suppressed.

In the p-type drift layer 2 of the SJ-MOSFET 50, a parallel pn structure 21 is provided. In the parallel pn structure 21, the n-type column regions (first columns of the first conductivity type) 4 and the p-type column regions (second columns of the second conductivity type) 3 are arranged in a plane parallel to the front surface of the $n^+$-type silicon carbide substrate 1 and repeatedly alternate one another. In an instance in which the n-type high-concentration regions 5 are provided, regions of the n-type high-concentration regions 5 sandwiched between the p-type column regions 3 are also included in the n-type column regions 4. The n-type column regions 4 are provided so as to reach the p-type base layer 6 from the surface of the n-type buffer layer 15 (in an instance in which the n-type buffer layer 15 is omitted, the $n^+$-type silicon carbide substrate 1).

Further, as the charge balance of the parallel pn structure 21, the product (impurity amount) of a width of the p-type column regions 3 and an impurity concentration of the p-type column regions 3 is substantially equal to a product (impurity amount) of a width of the n-type column regions 4 and an impurity concentration of the n-type column regions 4. In particular, the products are within ±5%. Therefore, the parallel pn structure 21 is known as a structure that concurrently obtains both low on-resistance and high breakdown voltage characteristics.

As depicted in FIG. 1, a backside electrode 13 is provided on a second main surface (backside surface, i.e., back surface of the silicon carbide semiconductor base substrate) of the $n^+$-type silicon carbide substrate 1. The backside electrode 13 configures a drain electrode. A drain electrode pad (not depicted) is provided on the surface of the backside electrode 13.

In the silicon carbide semiconductor base substrate, at the first main side thereof (the p-type base layer 6), a trench structure is formed. In particular, the p-type base layer 6 has a first surface and a second surface that are opposite to each other, the second surface facing the $n^+$-type silicon carbide substrate 1 and from the first surface of the p-type base layer 6 (the first main side of the silicon carbide semiconductor base substrate), trenches 16 penetrate through the p-type base layer 6 and reach the n-type high-concentration regions 5 (in an instance in which the n-type high-concentration regions 5 are omitted, the n-type column regions 4, hereinafter, simply "(4)"). Along inner walls of the trenches 16, a gate insulating film 9 is formed on bottoms and sidewalls of the trenches 16; gate electrodes 10 are formed on the gate insulating film 9 in the trenches 16. The gate electrodes 10 are insulated from the n-type high-concentration regions 5 (4) and the p-type base layer 6 by the gate insulating film 9. A portion of each of the gate electrodes 10 may protrude toward a later-described source electrode 12 from tops of the trenches 16.

In the n-type high-concentration regions 5 (4) and the n-type column regions 4, $p^+$-type base regions 14 may be selectively provided in each. Among the bottoms and bottom corner portions of the trenches 16, the $p^+$-type base regions 14 at least cover the bottoms of the trenches 16. The bottom corner portions of the trenches 16 are borders between the bottoms and the sidewalls of the trenches 16.

Pn junctions between the $p^+$-type base regions 14 and the n-type column regions 4 are formed at deep positions closer to the drain than are the bottoms of the trenches 16. Each of the $p^+$-type base regions 14 has an end that faces one of the trenches 16 and a depth position of said ends suffice to be at deep positions such that the pn junctions between the $p^+$-type base regions 14 and the n-type column regions 4 are closer to the drain than are the bottoms of the trenches 16 and may be variously changed according to design conditions. Application of high electric field to the gate insulating film 9 at portions along the bottoms of the trenches 16 may be prevented by the $p^+$-type base regions 14.

In a surface layer of the p-type base layer 6, $n^+$-type source regions (first semiconductor regions of the first conductivity type) 7 are selectively provided at the first main side of the semiconductor base substrate. Further, $p^{++}$-type contact regions 8 may be provided. The $n^+$-type source regions 7 are in contact with the trenches 16. Further, the $n^+$-type source regions 7 and the $p^{++}$-type contact regions 8 are in contact with one another. In the present specification, the front surface indicates the first main surface, for example, a (0001) plane (Si-face) of the $n^+$-type silicon carbide substrate 1; being provided on the surface of a semiconductor layer indicates that a semiconductor region/semiconductor layer is provided above the surface of said semiconductor layer; being provided in a surface layer of a semiconductor layer indicates that a semiconductor region/semiconductor layer that is exposed at the surface of said semiconductor layer is provided in said semiconductor layer.

In an entire area of the first main side of the silicon carbide semiconductor base substrate, an interlayer insulating film 11 is provided so as to cover the gate electrodes 10 embedded in the trenches 16. The source electrode 12 is in contact with the $n^+$-type source regions 7 and the p-type base layer 6 via contact holes opened in the interlayer insulating film 11. In an instance in which the $p^{++}$-type contact regions 8 are provided, the source electrode 12 is in contact with the $n^+$-type source regions 7 and the $p^{++}$-type contact regions 8. The source electrode 12, for example, is constituted by a NiSi film. The source electrode 12 is electrically insulated from the gate electrodes 10 by the interlayer insulating film 11. On the source electrode 12, the source electrode pad (not depicted) containing Al or AlSi is provided. Between the source electrode 12 and the interlayer insulating film 11, for example, a barrier metal (not depicted) that contains Ti and TiN and prevents diffusion of metal atoms from the source electrode 12 to the gate electrodes 10 may be provided.

Next, a method of manufacturing the superjunction silicon carbide semiconductor device according to the embodiment is described. FIGS. 2, 3, 4, and 5 are cross-sectional views schematically depicting states of the superjunction silicon carbide semiconductor device according to the embodiment during manufacture.

Figure 2:
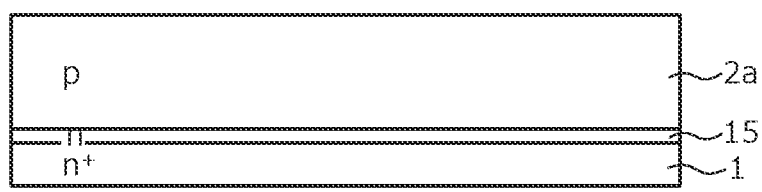
FIG. 2 is a cross-sectional view schematically depicting a state of the superjunction silicon carbide semiconductor device according to the embodiment during manufacture (part 1).

First, the $n^+$-type silicon carbide substrate 1 containing an n-type single crystal 4H-SiC is prepared. Then, on the first main surface of the $n^+$-type silicon carbide substrate 1, the n-type buffer layer 15 containing silicon carbide and doped with an n-type impurity, for example, nitrogen atoms may be epitaxially grown. Next, on the surface of the n-type buffer layer 15, a first p-type drift layer (epitaxial layer of the second conductivity type) 2a containing silicon carbide and doped with a p-type impurity, for example, aluminum atoms is epitaxially grown. The state up to here is depicted in FIG. 2. The resulting substrate in which layers such as the first p-type drift layer 2a are epitaxially grown on the $n^+$-type silicon carbide substrate 1 containing single crystal 4H-SiC is referred to as "single crystal 4H-SiC epitaxial substrate".

Figure 3:
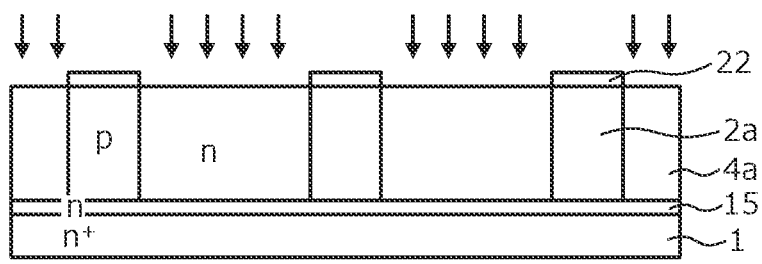
FIG. 3 is a cross-sectional view schematically depicting a state of the superjunction silicon carbide semiconductor device according to the embodiment during manufacture (part 2).

Next, on the surface of the first p-type drift layer 2a, an ion implantation mask 22 having predetermined openings is formed by a photolithographic technique using, for example, an oxide film. Then, ions of an element having an atomic weight that is less than an atomic weight of aluminum, for example, nitrogen ions (hereinafter, N ions), are implanted in the openings of the oxide film, thereby forming first n-type column regions (semiconductor regions of the first conductivity type) 4a. While described in detail hereinafter, in an instance in which N ions are implanted, preferably, the acceleration energy when the nitrogen is implanted may be in a range of 10 keV to 19 MeV. The state up to here is depicted in FIG. 3. Next, the ion implantation mask 22 is removed.

Figure 4:
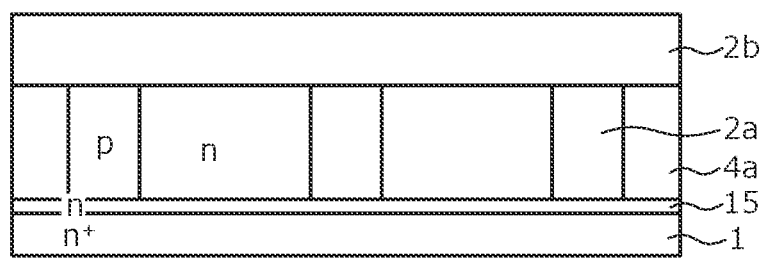
FIG. 4 is a cross-sectional view schematically depicting a state of the superjunction silicon carbide semiconductor device according to the embodiment during manufacture (part 3).
Figure 5:
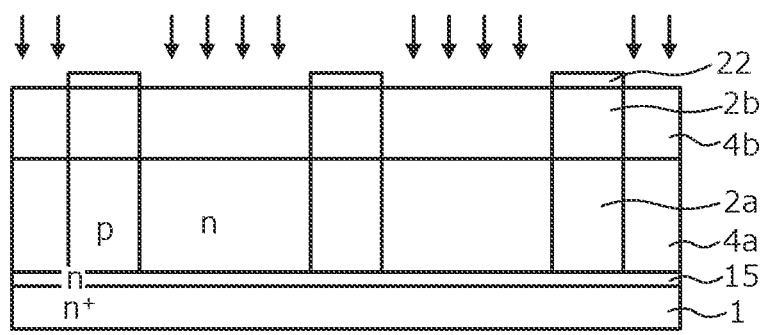
FIG. 5 is a cross-sectional view schematically depicting a state of the superjunction silicon carbide semiconductor device according to the embodiment during manufacture (part 4).

Next, on the surfaces of the first p-type drift layer 2a and the first n-type column regions 4a, a second p-type drift layer (epitaxial layer of the second conductivity type) 2b doped with aluminum is formed. The state up to here is depicted in FIG. 4. Next, on the surface of the second p-type drift layer 2b, the ion implantation mask 22 having predetermined openings is formed by a photolithographic technique using, for example, an oxide film. Then, ions of an element having an atomic weight less than that of aluminum, for example, N ions, are implanted in the openings of the oxide film, thereby forming second n-type column regions (semiconductor regions of the first conductivity type) 4b. The acceleration energy in an instance in which nitrogen is implanted is about the same as that in the instance in FIG. 3. The state up to here is depicted in FIG. 5. Next, the ion implantation mask 22 is removed.

Next, a process including the epitaxial growth depicted in FIG. 4 and the ion implantation depicted in FIG. 5 is repeated a predetermined number of times, thereby forming the p-type column regions 3 and the n-type column regions 4. The first p-type drift layer 2a and the second p-type drift layer 2b constitute portions of the p-type column regions 3 while the first n-type column regions 4a and the second n-type column regions 4b constitute portions of the n-type column regions 4. A portion of each of the n-type column regions 4 may be formed as the n-type high-concentration regions 5 by increasing the ion implantation amount when the n-type column regions 4 are formed. Further, after the n-type column regions 4 are formed, a portion of each of the n-type column regions 4 may be inverted, thereby forming the $p^+$-type base regions 14.

As just described, in the embodiment, N ions are periodically ion-implanted at a constant depth in the p-type drift layer 2 formed by epitaxial growth, whereby the parallel pn structure 21 is formed. The range of the ions relative to the acceleration energy during the ion implantation is dependent on the ion species, the lighter is the element, the longer the range tends to be. Therefore, with respect to single crystal SiC, N ions used as an n-type dopant have a longer range than Al ions used as a p-type dopant.

Figure 6:
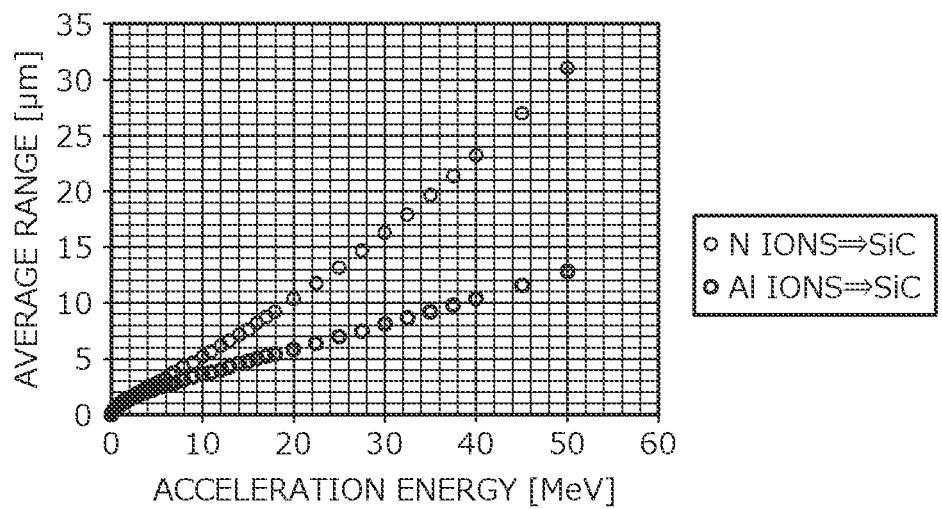
FIG. 6 is a graph showing average range simulation results for N ions and Al ions implanted in SiC.
Figure 7:
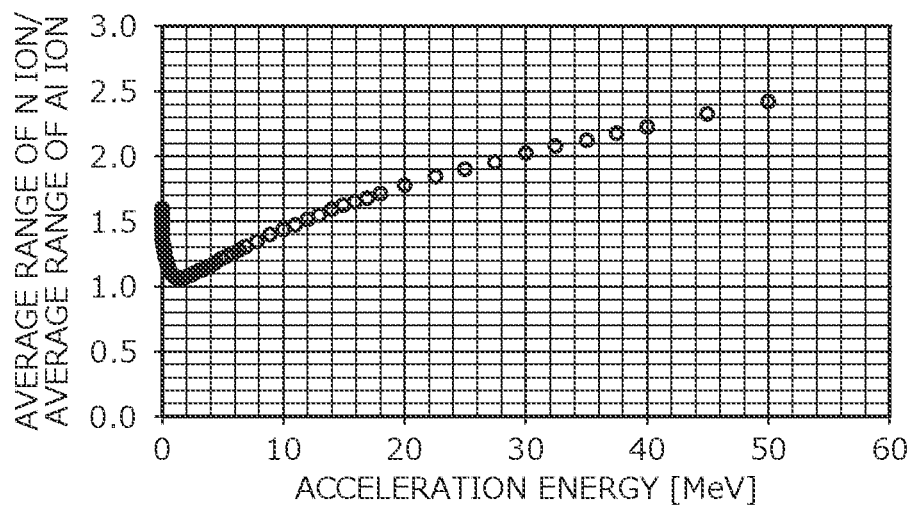
FIG. 7 is a graph showing results obtained by dividing the average range of the N ions by the average range of the Al ions.

Here, FIG. 6 is a graph showing simulation results of the average range with respect to acceleration energies of N ions and Al ions implanted in SiC. An average range was obtained for a SiC density of 3.21 g/cm$^3$. Further, the single crystal structure of SiC was not considered. In FIG. 6, a vertical axis indicates the average range of N ions and Al ions in units of μm while a horizontal axis indicates the acceleration energy of the N ions and the Al ions in units of MeV. The average range of the N ions is an average implantation depth from the surface of an epitaxial growth layer when N ions are ion-implanted in the p-type epitaxial growth layer and the average range of the Al ions is the average implantation depth from the surface of an epitaxial growth layer when Al ions are ion-implanted in the n-type epitaxial growth layer. FIG. 7 is a graph showing results obtained by dividing the average range of the N ions by the average range of the Al ions. In FIG. 7, a vertical axis indicates results obtained by dividing the average range of the N ions by the average range of the Al ions while a horizontal axis indicates the acceleration energy of the N ions and the Al ions in units of MeV.

As depicted in FIGS. 6 and 7, at the same acceleration energy, the N ions have an average range that is longer than that of the Al ions. For example, at an acceleration energy of 0.7 MeV, the average range of the Al ions is 0.6771 μm, however, the average range of the N ions is 0.7584 μm and thus, the N ions have an average range that is about 1.1 times that of the Al ions. Further, for an acceleration energy of 20 Mev, the average range of the Al ions is 5.83 μm, however, the average range of the N ions is 10.33 μm and thus, the N ions have an average range that is about 1.8 times that of the Al ions. As just described, while there is variation of the results due to acceleration energy, when the acceleration energy is in a range of 10 keV to 50 MeV, the N ions have an average range that is longer than that for the Al ions. Therefore, preferably, the acceleration energy when the N ions are implanted may be in a range of 10 keV to 50 MeV.

As just described, compared to implanting Al ions in an n-type epitaxial growth layer, implanting the ions in a p-type epitaxial growth layer enables deeper ion implantation. Therefore, the depth of the parallel pn structure formed by the process including one session of epitaxial growth and one session of ion implantation may be deeper than in an instance in which formation is by implanting N ions. Accordingly, the number of times the process including epitaxial growth and ion implantation is performed when forming the parallel pn structure of a predetermined width is less for an instance in which formation is by implanting N ions than for an instance in which formation is by implanting Al ions. As a result, in the embodiment, it becomes possible to reduce the number of stages of the epitaxial growth and ion implantation, whereby the lead-time for device manufacturing may be shortened and the manufacturing cost may also be reduced. Here, while N is taken as an example of an element having an atomic weight that is less than that of Al, the effects described above are similarly obtained for elements, other than N, that have an atomic weight less than that of Al. Further, it is possible to ion-implant N ions at room temperature and therefore, increasing and reducing the temperature of the single crystal 4H-SiC epitaxial substrate becomes unnecessary, thereby also enabling reduction of the takt time for ion implantation processes.

Next, on the surfaces of the p-type column regions 3 and the n-type column regions 4, the p-type base layer 6 doped with a p-type impurity such as aluminum is formed. Next, on the surface of the p-type base layer 6, an ion implantation mask having predetermined openings is formed by photolithography and, for example, has a layered structure formed by oxide films, semiconductor films, or oxide film(s)/semiconductor film(s). In the openings, an n-type impurity such as phosphorus (P) is ion-implanted, thereby forming in portions of the p-type base layer 6, at the surface thereof, the $n^+$-type source regions 7. Next, the ion implantation mask used in forming the $n^+$-type source regions 7 is removed and by a similar method, an ion implantation mask having predetermined openings may be formed and in the openings, a p-type impurity such as aluminum may be ion-implanted in portions of the p-type base layer 6, whereby the $p^{++}$-type contact regions 8 may be formed. An impurity concentration of the $p^{++}$-type contact regions 8 is set to be higher than an impurity concentration of the p-type base layer 6.

Next, a heat treatment (annealing) is performed under an inert gas atmosphere of about 1700 degrees C., whereby an activation process for the n-type column regions 4, the $n^+$-type source regions 7, the $p^{++}$-type contact regions 8, etc. is implemented. As described above, the ion-implanted regions may be collectively activated by a single session of the heat treatment or may be activated by performing the heat treatment each time ion implantation is performed.

Next, on the surface of the p-type base layer 6, a trench formation mask having predetermined openings is formed by photolithography using, for example, an oxide film. Next, the trenches 16 that penetrate through the p-type base layer 6 and reach the n-type high-concentration regions 5 (4) are formed by dry etching. The bottoms of the trenches 16 may reach the $p^+$-type base regions 14 formed in the n-type high-concentration regions 5 (4). Next, the trench formation mask is removed.

Next, along the surfaces of the $n^+$-type source regions 7 and the bottoms and the sidewalls of the trenches 16, the gate insulating film 9 is formed. The gate insulating film 9 may be formed by thermal oxidation of a temperature of about 1000 degrees C. under an oxygen atmosphere. Further, the gate insulating film 9 may be formed by a deposition method by a chemical reaction such as that for a high-temperature oxide (HTO).

Next, on the gate insulating film 9, for example, a polycrystal silicon layer doped with phosphorus atoms is provided. The polycrystal silicon layer may be formed so as to be embedded in the trenches 16. The polycrystal silicon layer is patterned by photolithography and left in the trenches 16, thereby forming the gate electrodes 10.

Next, for example, a phosphate glass having a thickness of about 1 µm is deposited so as to cover the gate insulating film 9 and the gate electrodes 10, thereby forming the interlayer insulating film 11. Next, the barrier metal (not depicted) containing titanium (Ti) or titanium nitride (TiN) may be formed so as to cover the interlayer insulating film 11. The interlayer insulating film 11 and the gate insulating film 9 are patterned by photolithography, whereby contact holes that expose the $n^+$-type source regions 7 are formed. In an instance in which the $p^{++}$-type contact regions 8 are formed, contact holes that expose the $n^+$-type source regions 7 and the $p^{++}$-type contact regions 8 are formed. Thereafter, a heat treatment (reflow) is performed, thereby planarizing the interlayer insulating film 11.

Next, in the contact holes and on the interlayer insulating film 11, a conductive film constituting the source electrode 12 is provided. The conductive film is selectively removed, leaving the source electrode 12 only in the contact holes, whereby the $n^+$-type source regions 7 and the source electrode 12 are in contact with one another. In an instance in which the $p^{++}$-type contact regions 8 are formed, the $n^+$-type source regions 7 and the $p^{++}$-type contact regions 8 are in contact with the source electrode 12. Next, the source electrode 12 outside the contact holes is selectively removed.

Next, for example, by a sputtering method, on the source electrode 12 on the front surface of the silicon carbide semiconductor base substrate and on an upper portion of the interlayer insulating film 11, an electrode pad constituting the source electrode pad (not depicted) is deposited.

Next, on the second main surface of the $n^+$-type silicon carbide semiconductor substrate 1, the backside electrode 13 containing nickel or the like is provided. Thereafter, a heat treatment is performed under an inert gas atmosphere of about 1000 degrees C., thereby forming the backside electrode 13 to be in ohmic contact with the $n^+$-type silicon carbide semiconductor substrate 1. In an instance in which the trenches 16 are not to be formed, in surface regions of the p-type base layer 6, n-type well regions are formed; the front side of the silicon carbide semiconductor base substrate is thermally oxidized; the gate insulating film 9 is formed; the p-type base layer 6 and regions formed in the p-type base layer 6l, at the surface of the p-type base layer 6 are covered by the gate insulating film 9; the polycrystal silicon layer is formed on the gate insulating film 9 as the gate electrodes 10; the polycrystal silicon layer is patterned and selectively removed, leaving the polycrystal silicon layer on portions of the p-type base layer 6 sandwiched between the $n^+$-type source regions 7 and the n-type well regions; and the interlayer insulating film 11 is formed so as to cover the gate electrodes 10. As just described, the silicon carbide semiconductor device depicted in FIG. 1 is completed.

As described above, according to the method of manufacturing the superjunction silicon carbide semiconductor device according to the embodiment, ions of an element having an atomic weight that is less than that of Al are periodically ion-implanted at a constant depth in an epitaxially grown p-type drift layer, whereby the parallel pn structure is formed. As a result, the number of times the process of epitaxial growth and ion implantation is repeated when the parallel pn structure of a predetermined thickness is formed may be less than that in an instance in which formation is by implanting Al ions. Therefore, it becomes possible to reduce the number of stages of the epitaxial growth and ion implantation, thereby enabling shortening of the lead-time for device manufacturing.

In the invention described above, while an instance in which a main surface of the silicon carbide substrate containing silicon carbide is a (0001) plane and on the (0001) plane, a MOS is configured has been described as an example, without limitation hereto, various modifications such as relating to the wide band gap semiconductor, orientation of the main surface of the substrate, etc. are possible.

Further, in the embodiments of the present invention, while a trench-type MOSFET is described as an example, without limitation hereto, application is further possible to semiconductor devices of various configurations such as a MOS-type semiconductor device like an IGBT, a planar-type MOSFET, etc.

As described above, ions of an element having an atomic weight that is less than that of Al are periodically ion-implanted at a constant depth in an epitaxially grown p-type drift layer (epitaxial layer of the second conductivity type), whereby the parallel pn structure is formed. As a result, the number of times the process of epitaxial growth and ion implantation is repeated when the parallel pn structure of a predetermined thickness is formed may be less than that in an instance in which formation is by implanting Al ions. Therefore, it becomes possible to reduce the number of stages of the epitaxial growth and ion implantation, thereby enabling shortening of the lead-time for device manufacturing and reduction of the manufacturing cost.

The method of manufacturing a superjunction silicon carbide semiconductor device according to the present invention achieves an effect in that the number of times a combination of epitaxial growth and ion implantation for forming the parallel pn structure is performed may be reduced.

As just described, the method of manufacturing a superjunction silicon carbide semiconductor device according to the present invention is useful for high-voltage semiconductor devices used in power converting equipment, power source devices of various types of industrial machines, etc.

REFERENCE CHARACTERS 1, 101 $n^+$-type silicon carbide substrate
2 p-type drift layer 2a first p-type drift layer
2b second p-type drift layer
3, 103 p-type column regions
103a first p-type column regions
103b second p-type column regions
4, 104 n-type column regions
4a first n-type column regions
4b second n-type column regions
5, 105 n-type high-concentration region
6, 106 p-type base layer
7, 107 n$^+$-type source regions
8, 108 p$^{++}$-type contact regions
9, 109 gate insulating film
10, 110 gate electrodes
11, 111 interlayer insulating film
12, 112 source electrode
13, 113 backside electrode
14, 114 p$^+$-type base regions
15, 115 n-type buffer layer
16, 116 trenches
21, 121 parallel pn structure
22, 122 ion implantation mask
123 n-type drift layer
123a first n-type drift layer
123b second n-type drift layer
50, 150 SJ-MOSFET

The invention claimed is:

1. A method of manufacturing a superjunction silicon carbide semiconductor device, the method comprising:
as a first process, forming a parallel pn structure on a front surface of a silicon carbide semiconductor substrate of a first conductivity type, the parallel pn structure having a plurality of first columns of the first conductivity type and a plurality of second columns of a second conductivity type, the first columns and the second columns being disposed repeatedly alternating one another in a plane parallel to the front surface;
as a second process, forming a first semiconductor layer of the second conductivity type at a surface of the parallel pn structure;
as a third process, selectively forming a plurality of first semiconductor regions of the first conductivity type in a surface layer of the first semiconductor layer;
as a fourth process, forming a gate insulating film in contact with the first semiconductor layer;
as a fifth process, forming a gate electrode on a first surface of the gate insulating film, the first surface being opposite to a second surface of the gate insulating film, the second surface being in contact with the first semiconductor layer;
as a sixth process, forming a first electrode in contact with the first semiconductor layer and the first semiconductor regions; and
as a seventh process, forming a second electrode on a back surface of the silicon carbide semiconductor substrate, wherein
in the first process, forming an epitaxial layer of the second conductivity type on the front surface of the silicon carbide semiconductor substrate and selectively forming a plurality of semiconductor regions of the first conductivity type by implanting nitrogen ions in the epitaxial layer are repeated a plurality of times, thereby forming the parallel pn structure.

2. The method according to claim 1, wherein
an acceleration energy when the nitrogen ions are implanted is in a range of 10 keV to 50 MeV.

3. The method according to claim 1, further comprising after the third process but before the fourth process
as an eighth process, forming a plurality of trenches that penetrate through the first semiconductor layer and the first semiconductor regions and reach the first columns, wherein
in the fourth process, the gate insulating film is formed in each of the trenches, and
in the fifth process, the gate electrode is formed in each of the trenches via the gate insulating film.

* * * * *